United States Patent [19]

Glover et al.

[11] Patent Number: 5,220,295
[45] Date of Patent: Jun. 15, 1993

[54] METHOD AND APPARATUS FOR DETECTING AND CORRECTING LOSS OF FREQUENCY LOCK IN A PHASE LOCKED DUAL CLOCK SYSTEM

[75] Inventors: Neal Glover, Bloomfield; Peter Murray, Louisville, both of Colo.

[73] Assignee: Cirrus Logic, Inc., Fremont, Calif.

[21] Appl. No.: 867,978

[22] Filed: Apr. 13, 1992

[51] Int. Cl.$^5$ .............................................. H03L 7/00
[52] U.S. Cl. .................................. 331/25; 331/DIG. 2
[58] Field of Search ................. 331/1 A, 25, DIG. 2; 328/133, 134, 155

[56] References Cited

U.S. PATENT DOCUMENTS 3,956,710  5/1976  Seitz et al. ................. 331/DIG. 2 X
4,646,031  2/1987  Fast et al. .............................. 331/25

FOREIGN PATENT DOCUMENTS 0116335  9/1981  Japan ............................ 331/DIG. 2
0145933  7/1986  Japan ............................ 331/DIG. 2

Primary Examiner—Robert J. Pascal
Attorney, Agent, or Firm—Blakely, Sokoloff, Taylor & Zafman

[57] ABSTRACT

A Loss of Lock Detector and Re-lock Control function using digital techniques to detect a programmable difference in frequencies over a programmable range. Once Loss of Lock is detected, the Re-lock sequence is initiated and PLLIS, PLLMS & PLLGS are stepped through a programmable sequence. The invention detects the frequency difference by counting down two counters and evaluating the value left in one when the other reaches terminal count using a programmable tolerance of frequency differences before Loss of Lock is declared. The complexity and cost of implementation of the invention is reduced by multiple use of a single down counter. Other features of the invention are disclosed.

1 Claim, 19 Drawing Sheets

METHOD AND APPARATUS FOR DETECTING AND CORRECTING LOSS OF FREQUENCY LOCK IN A PHASE LOCKED DUAL CLOCK SYSTEM

FIELD OF THE INVENTION

This invention relates generally to digital computer systems, particularly to the detection of, and recovery from, loss of frequency lock in a system involving two clocks which are required to be in phase and frequency lock. More particularly, the invention relates to detection and recovery from loss of frequency lock between a reference frequency and a Phase Locked Loop controlled frequency, whose gain, mode and input source is selectable.

BACKGROUND OF THE INVENTION

In a typical disk drive system, gross timing is maintained by the spin control servo system. This system usually achieves better than 1% tolerance. When the drive is operating at the nominal spin rate, the data clock (PLLCLK, extracted from the data stream) will be in exact frequency lock with the crystal based reference frequency (REFCLK). As a check on the accuracy of the spin control servo, one can monitor the difference between the data clock and the crystal clock. Loss of frequency lock is defined in terms of frequency drift per unit time.

Another more important reason to monitor the frequency difference between PLLCLK and REFCLK is so that one can detect when the PLLCLK is incorrectly locking on the data stream. This can occur if disk orientation is lost or if there are sufficient errors in the data stream to cause the PLL (phase locked loop) to lock on the wrong frequency. When frequency synchronization between the PLLCLK and the data stream is lost, errors are introduced into the decoded data stream, which the error correction code (ECC) must correct. Therefore, it is imperative to regain synchronization as soon as possible.

During initial lock, the PLL should be locking on the data stream. Gain should be set to HIGH and Mode should be set to PHASE/FREQUENCY. After Lock is acquired, the Gain should be set LOW and the Mode set to PHASE ONLY. While Device Read Gate (DRG) is still asserted, the input selector should remain selecting the data stream. When DRG is de-asserted, the Input Select should be switched to the Reference Frequency (REFCLK).

At times, the data stream may fall out of lock with the reference frequency. When this occurs, re-lock must be accomplished quickly in order to minimize the amount of data requiring correction. Re-lock can generally be accomplished by selecting the Reference Frequency with the Input Select, setting the Mode to PHASE/FREQUENCY and the Gain to HIGH. After an appropriate amount of time, the PLL input should be switched back to the data stream and the Mode set to PHASE ONLY. After running with these settings for a period of time, the PLL can be returned to LOW Gain. (The foregoing mnemonics, control settings, etc. set out in capital letters are well known in the relevant art, and therefore are not specifically defined herein.)

BRIEF SUMMARY OF THE INVENTION

In the present invention, the Loss of Lock Detector and Re-lock Control function uses digital techniques to detect a programmable difference in frequencies over a programmable range. Once Loss of Lock is detected, the Re-lock sequence is initiated and PLLIS, PLLMS & PLLGS are stepped through a programmable sequence.

It is an object of the invention to detect Loss of Lock between two frequencies.

Another object of the invention is to provide a programmable range over which the Loss of Lock will be detected.

A third object of the design is to detect the frequency difference by counting down two counters and evaluating the value left in one when the other reaches terminal count.

A still further object is to provide a programmable tolerance of frequency differences before Loss of Lock is declared.

Another object of the invention is to activate the PLL control signals (PLLIS, PLLMS and PLLGS) so as to recover from the loss of frequency lock once the lock is lost.

Yet another object of the invention is to provide a programmable means of asserting the PLL control signals.

Another object of the invention is to reduce the complexity and cost of implementation of the invention by multiple use of a single down counter.

DETAILED DESCRIPTION OF THE PREFERRED EMBODIMENT

Figure 1:
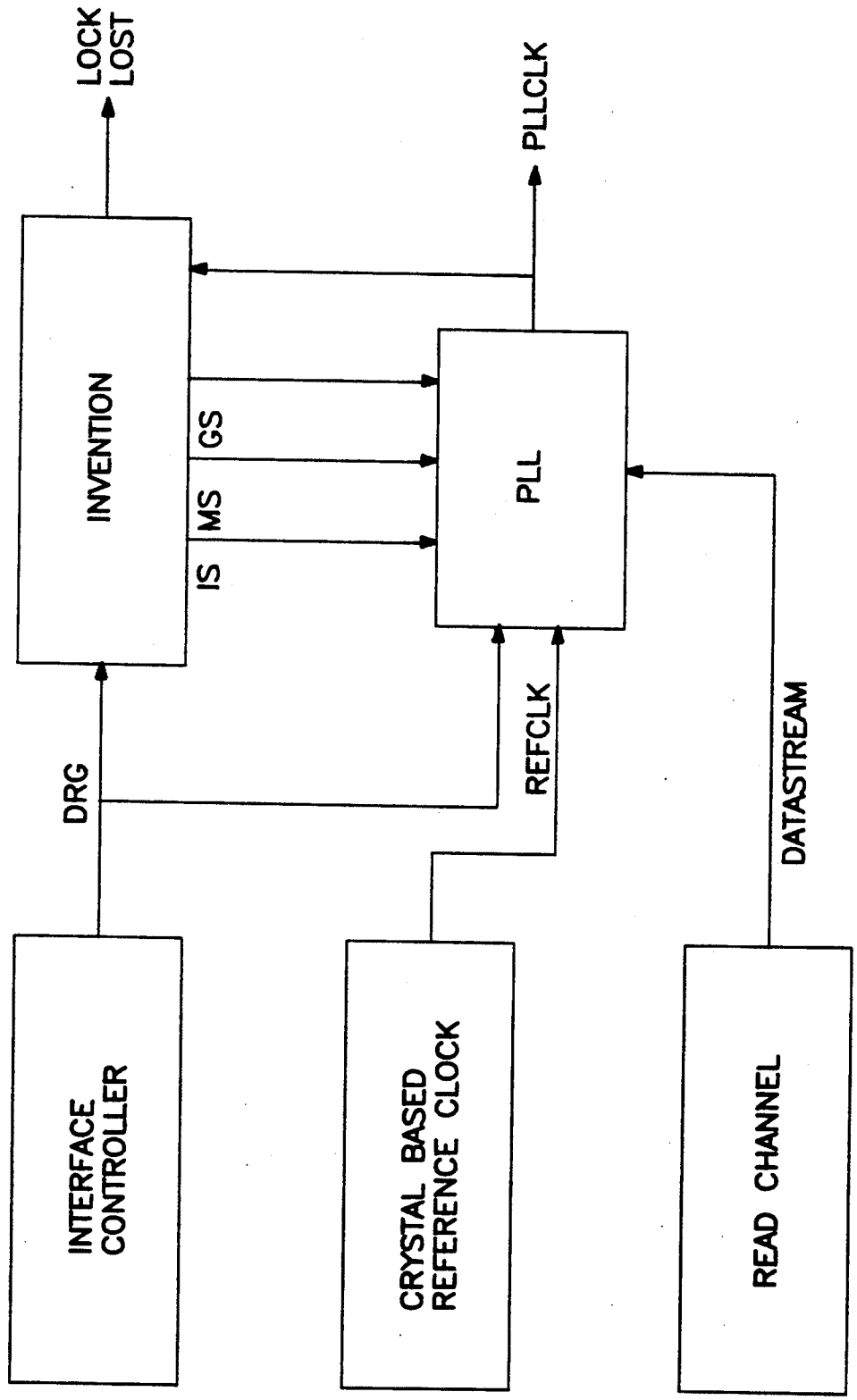
FIG. 1 shows a block diagram of a portion of a disk drive system.

In FIG. 1, the Loss of Lock Detector and Recovery circuit is shown in reference to the read channel electronics, the PLL circuitry and the REFCLK generator. A signal indicating that loss of lock has occurred is also generated for use in extending the error correction capability of the ECC code. For added flexibility, the polarities of the control signals PLLIS, PLLMS and PLLGS are programmable.

When PLLIS is asserted, the data stream is input to the PLL. REFCLK is selected otherwise. When PLLMS is asserted, the PLL is in the PHASE ONLY Mode of operation. Also when PLLGS is asserted, the PLL Gain is set to HIGH.

Figure 2:
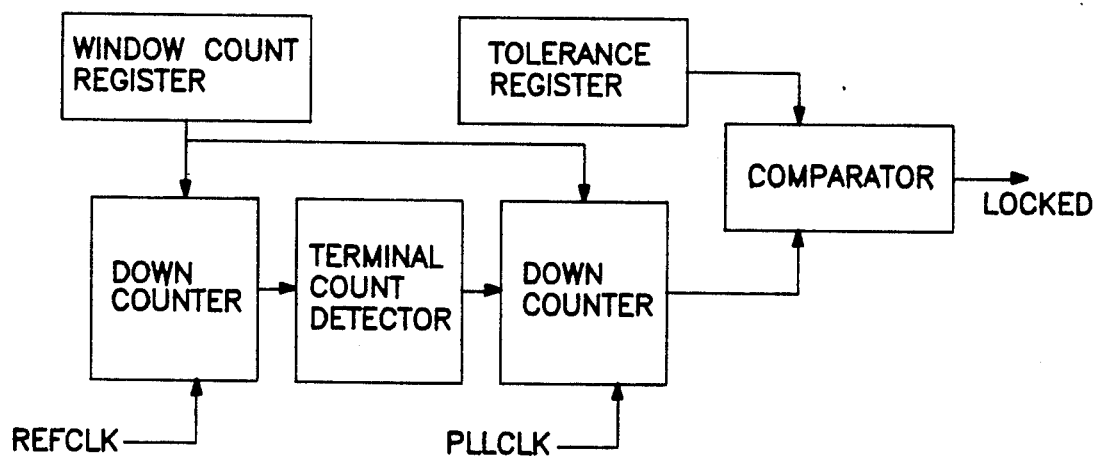
FIG. 2 shows a block diagram of the Loss of Lock detector.
Figure 3:
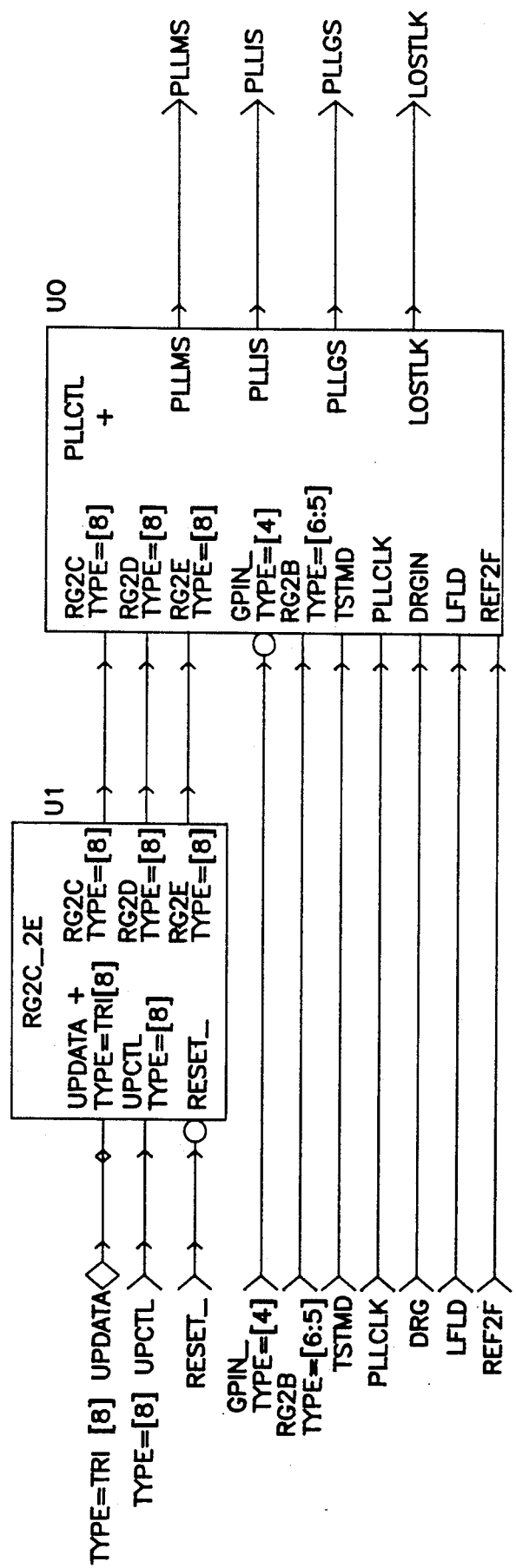
FIG. 3 shows the top level schematic of the invention (PLL).

FIG. 2 shows the block diagram of the Loss of Lock Detector. Detailed circuit diagrams for a preferred embodiment of the invention are provided in FIGS. 3 through 12. Since the individual devices and the interconnection thereof are clearly shown therein, such circuit details shall not be described herein, but instead the circuits shall be functionally described to illustrate the unique characteristics thereof. In the detailed circuits shown, the signal REFCLK and the signal REF2F are equivalent. The following is a list of each signal entering the top level schematic of the invention:

UPDATA = Eight bit bi-directional data bus for reading and writing the registers 2C-2E.

UPCTL = Eight control signals used to effect the microprocessor reads and writes to registers 2C-2E.

RESET_ = General reset signal to initialize the circuit.

GPIN_ = Four bits used to test the invention in a non-operational test mode.

RG2B.4 = Signal used to select the use of the optional External Loss of Lock Detected signal.

RG2B.5 = Polarity select for the optional External Loss of Lock Detected.

TSTMD = Signal indicating that the test mode is active.

PLLCLK = Clock extracted from the data stream by the PLL circuitry.

DRG = Device Read Gate.

LFLD = An optional External Loss of Lock Detected signal used to initiate the re-lock sequence.

REF2F = REFCLK, the Reference Clock.

PLLMS = PLL Mode Select.

PLLIS = PLL Input Select.

PLLGS = PLL Gain Select.

LOSTLK = Signal indicating loss of lock.

Programmable values for Lock Delay, Re-lock Delay, Re-lock Time, Window Count and Tolerance are stored in registers 2C-2E along with the polarity selection for the control outputs PLLIS, PLLMS, PLLGS and the input select control and polarity selection for the optional External Loss of Frequency Lock Detected Input.

Loss of lock is defined as a frequency difference exceeding the Tolerance threshold between the two input clocks. In this digital loss of lock detector, the frequency difference is measured over a programmable time interval (the Window Count).

Lock Delay specifies the amount of time to wait before asserting the PLLGS and PLLMS signals.

Re-lock Time is the amount of time that the PLLIS and PLLMS signals will remain de-asserted after a re-lock sequence is initiated.

Re-lock Delay specifies the amount of time to wait before re-asserting the PLLGS signal during the re-lock sequence.

In FIGS. 3 through 12, the signal REF2F refers to the reference clock REFCLK. DRG (Device Read Gate) is the signal which indicates that the data stream is entering a section where the PLL should be able to lock onto the correct frequency.

Figure 4A:
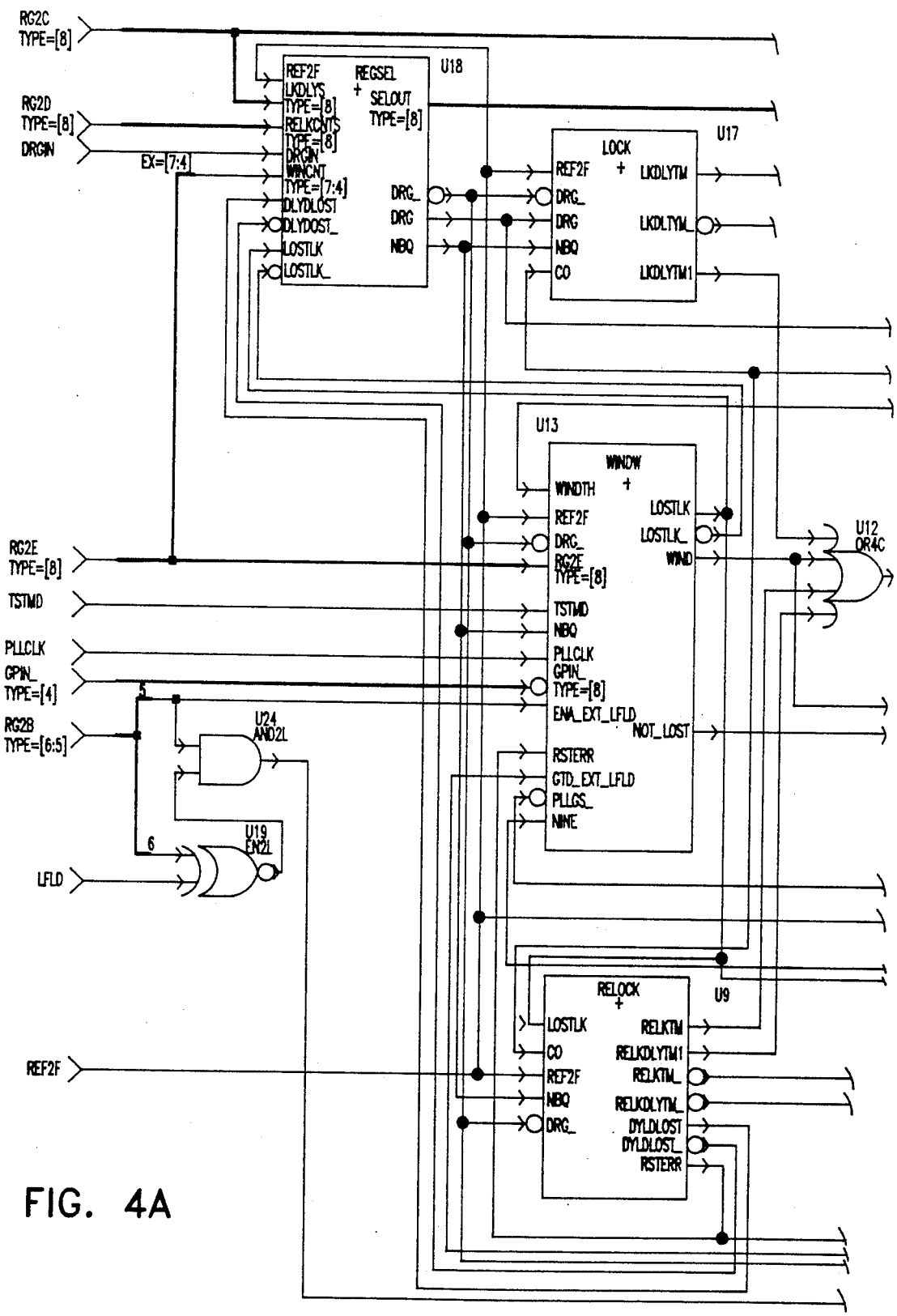
FIGS. 4a and b show the Loss of Lock Detection and Re-Lock control schematic (PLLCTL).
Figure 4B:
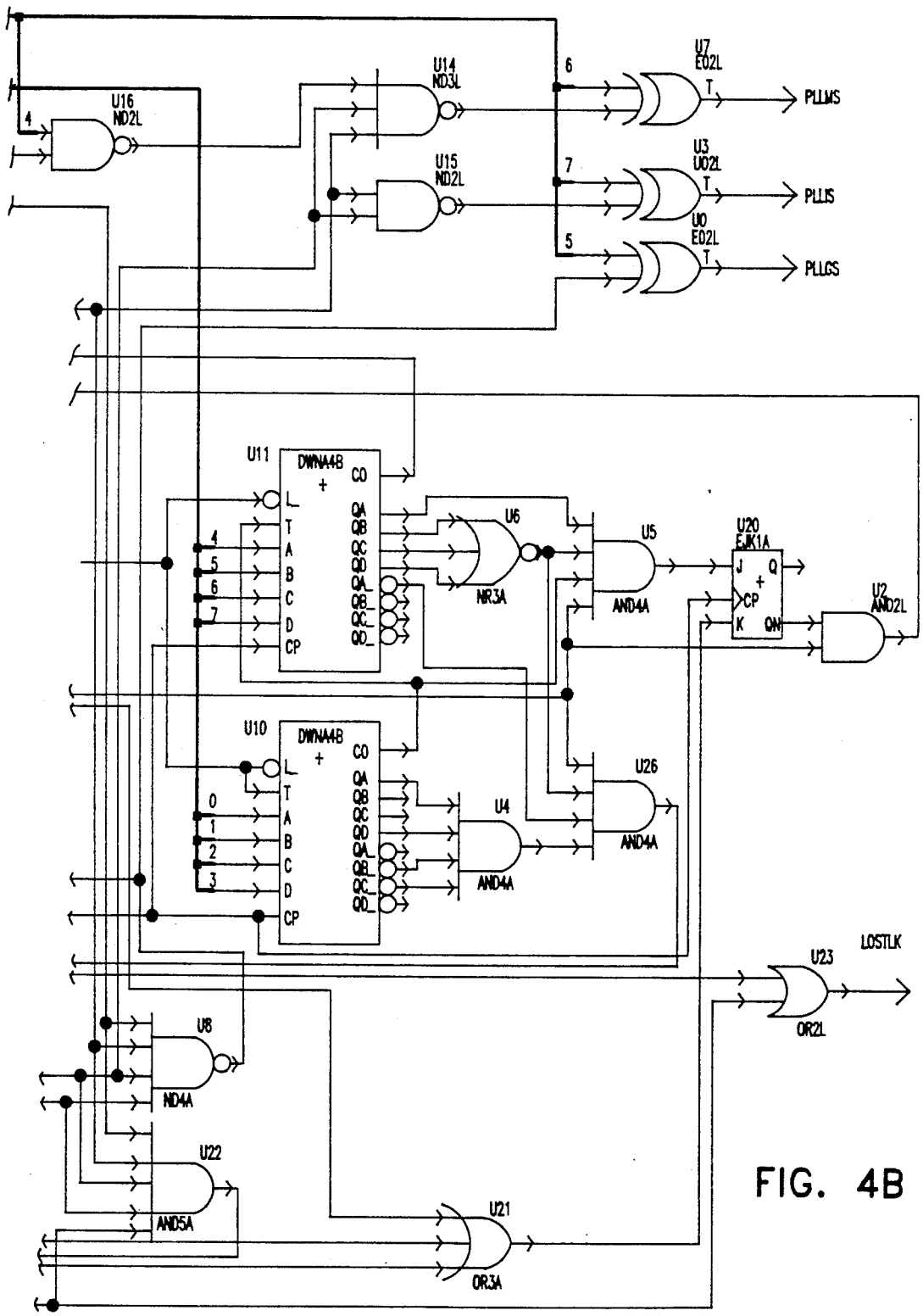
Figure 5A:
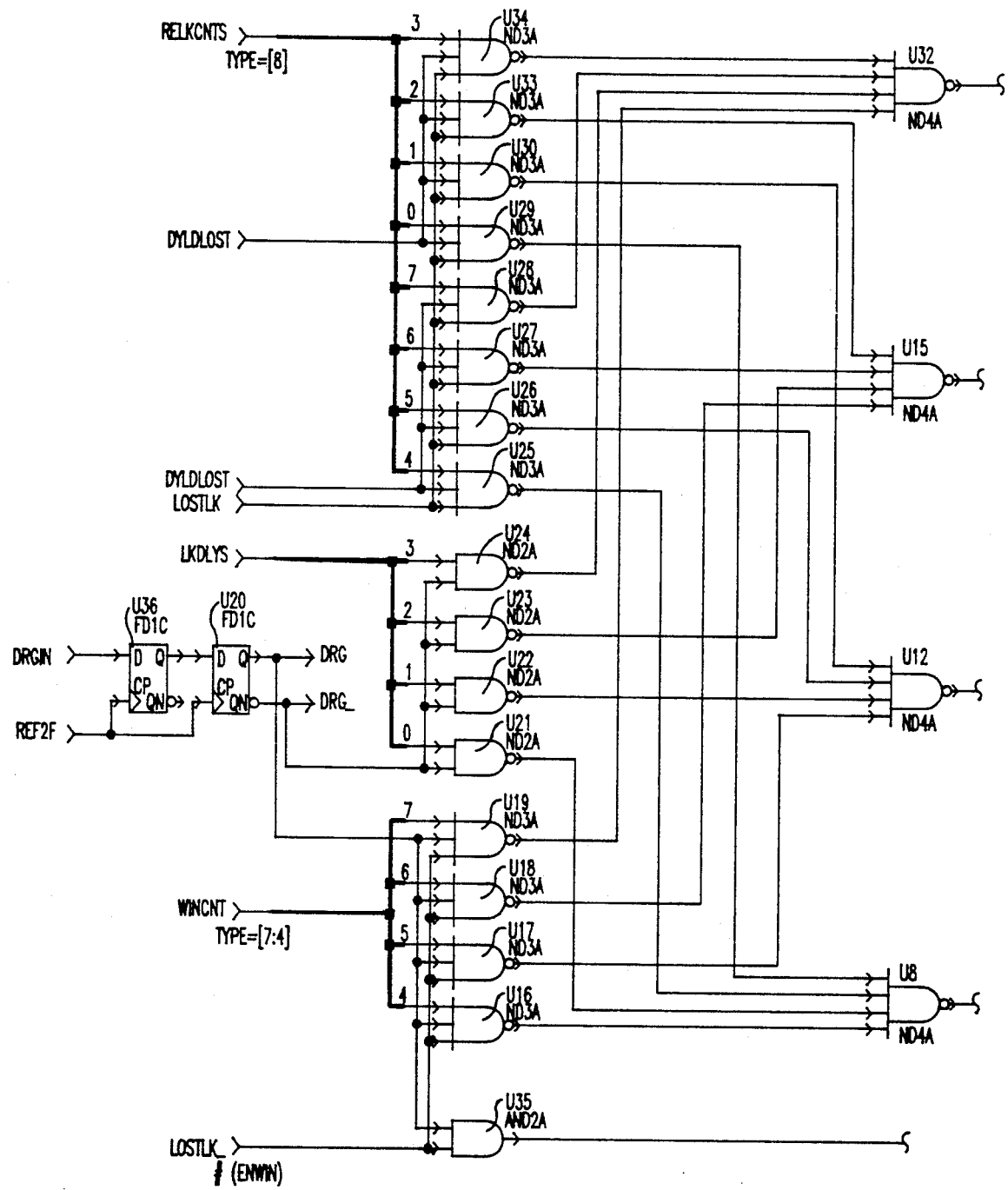
FIGS. 5a and b show the Register Selection Block schematic (REGSEL).
Figure 5B:
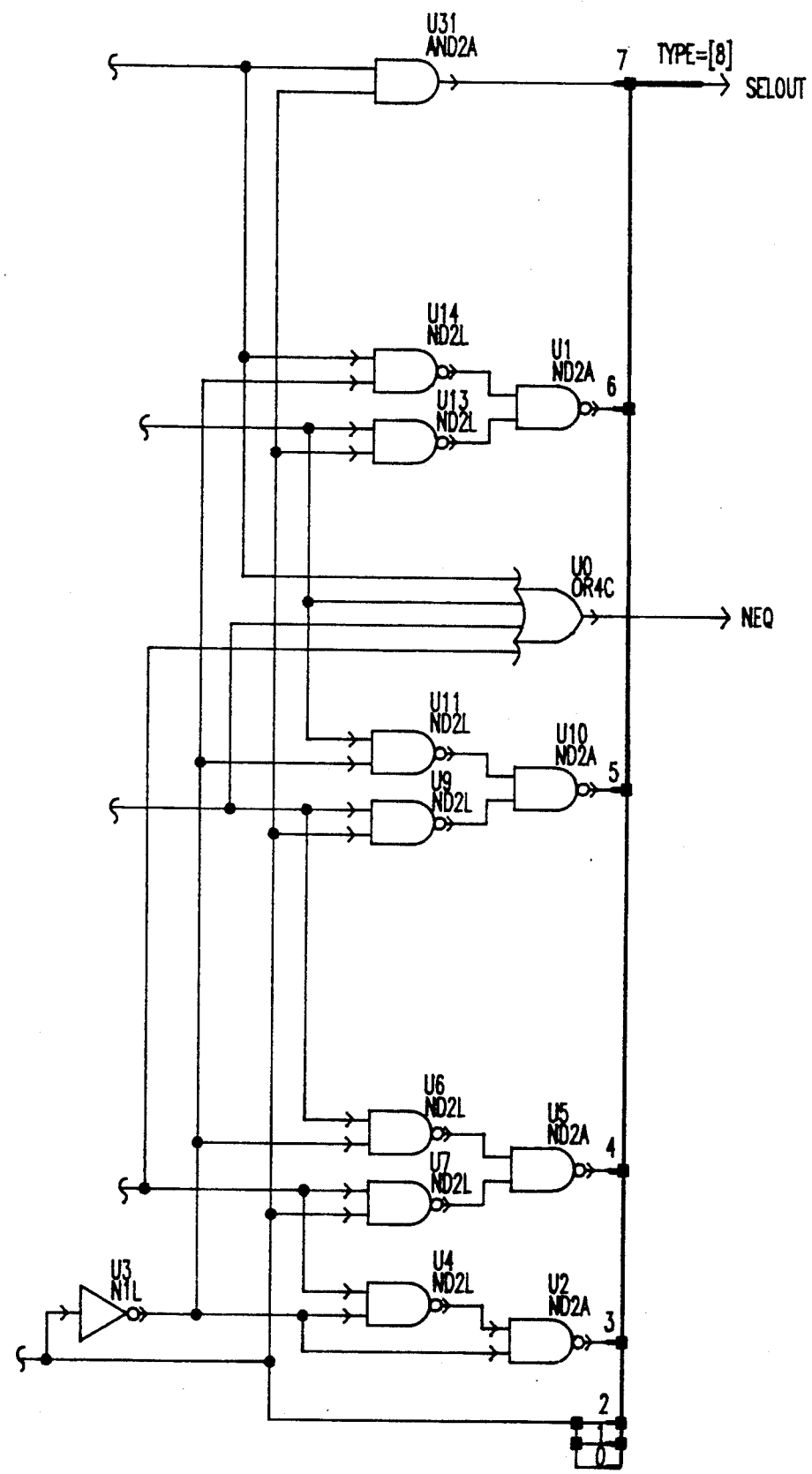
Figure 6:
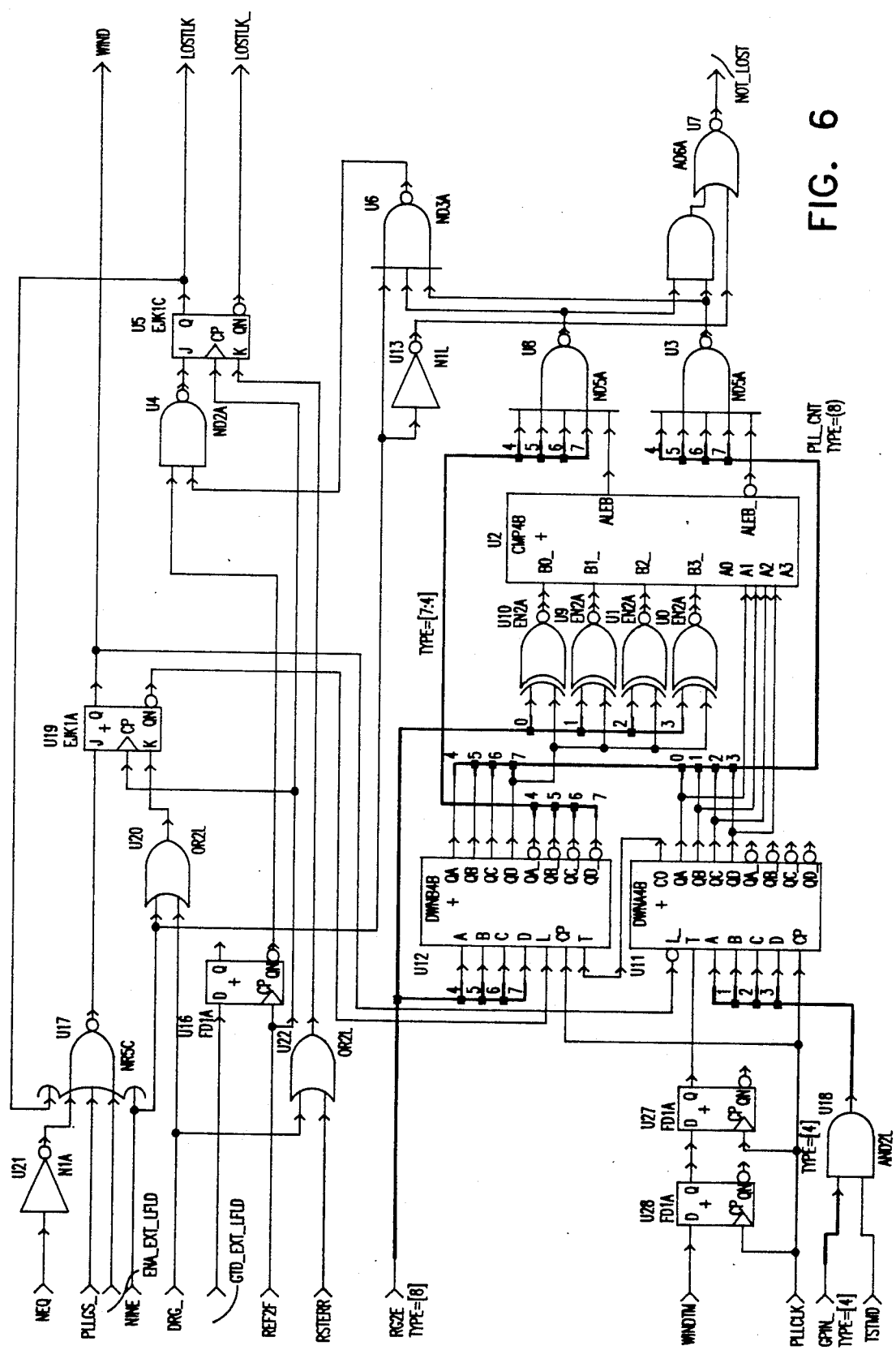
FIG. 6 shows the PLLCLK counter and window comparator block schematic (WINDW).
Figure 7:
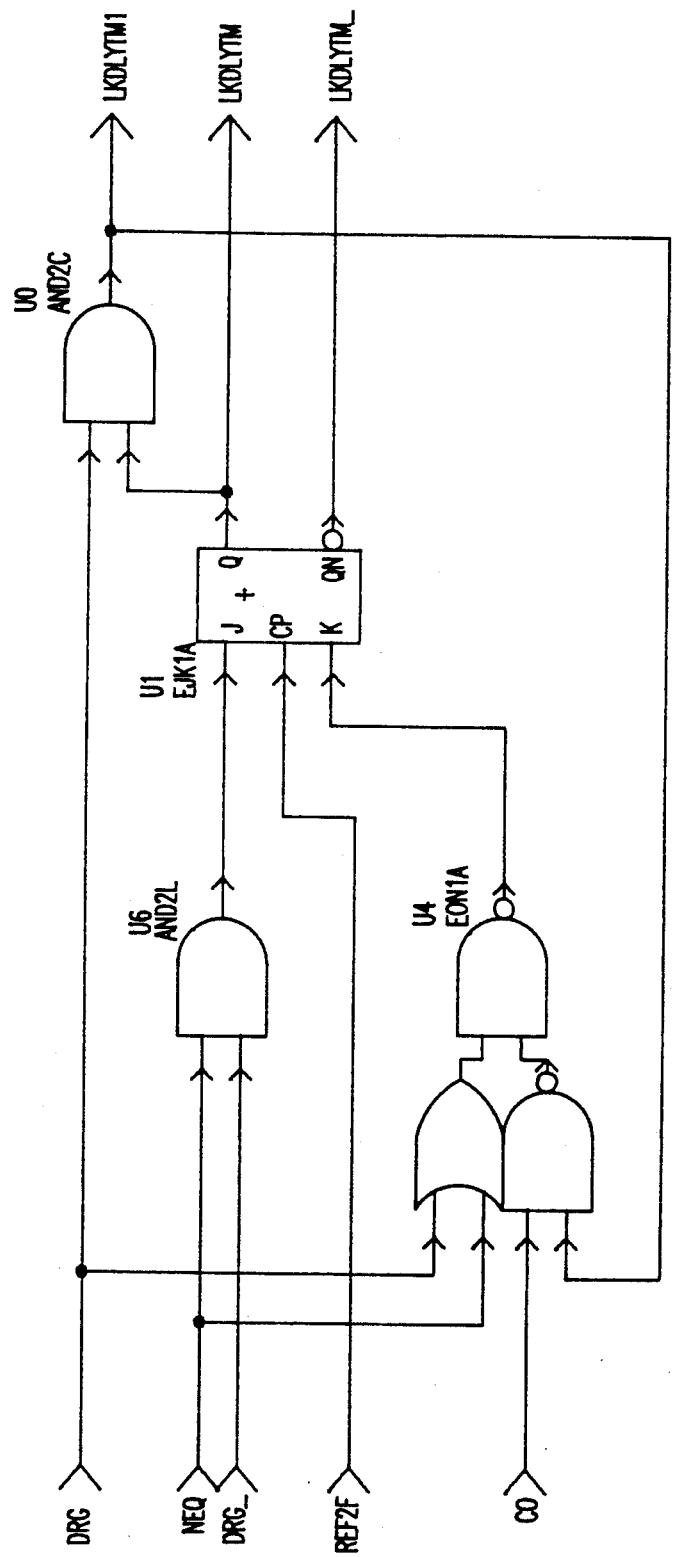
FIG. 7 shows the LOCK block schematic.
Figure 8:
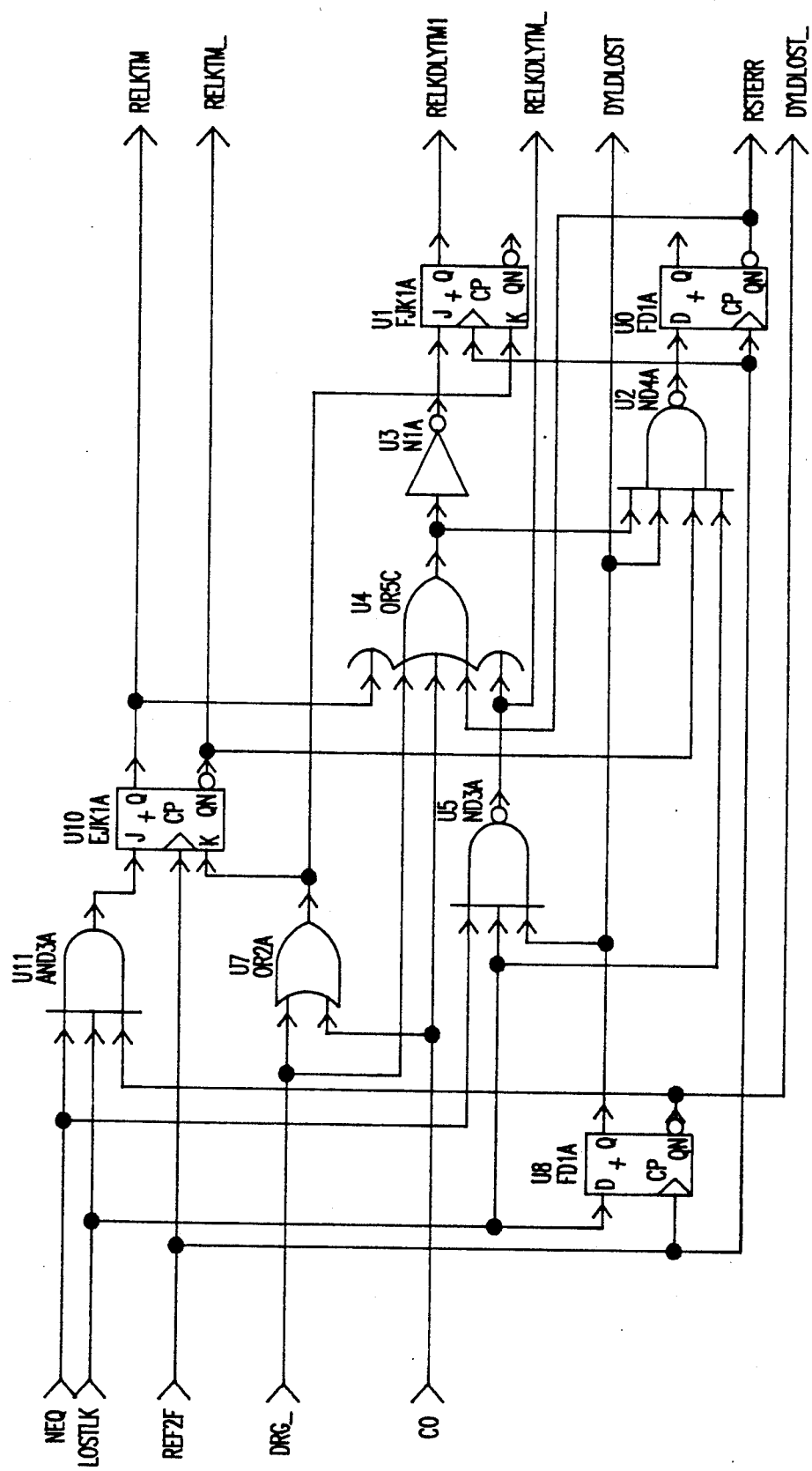
FIG. 8 shows the RELOCK block schematic.
Figure 9:
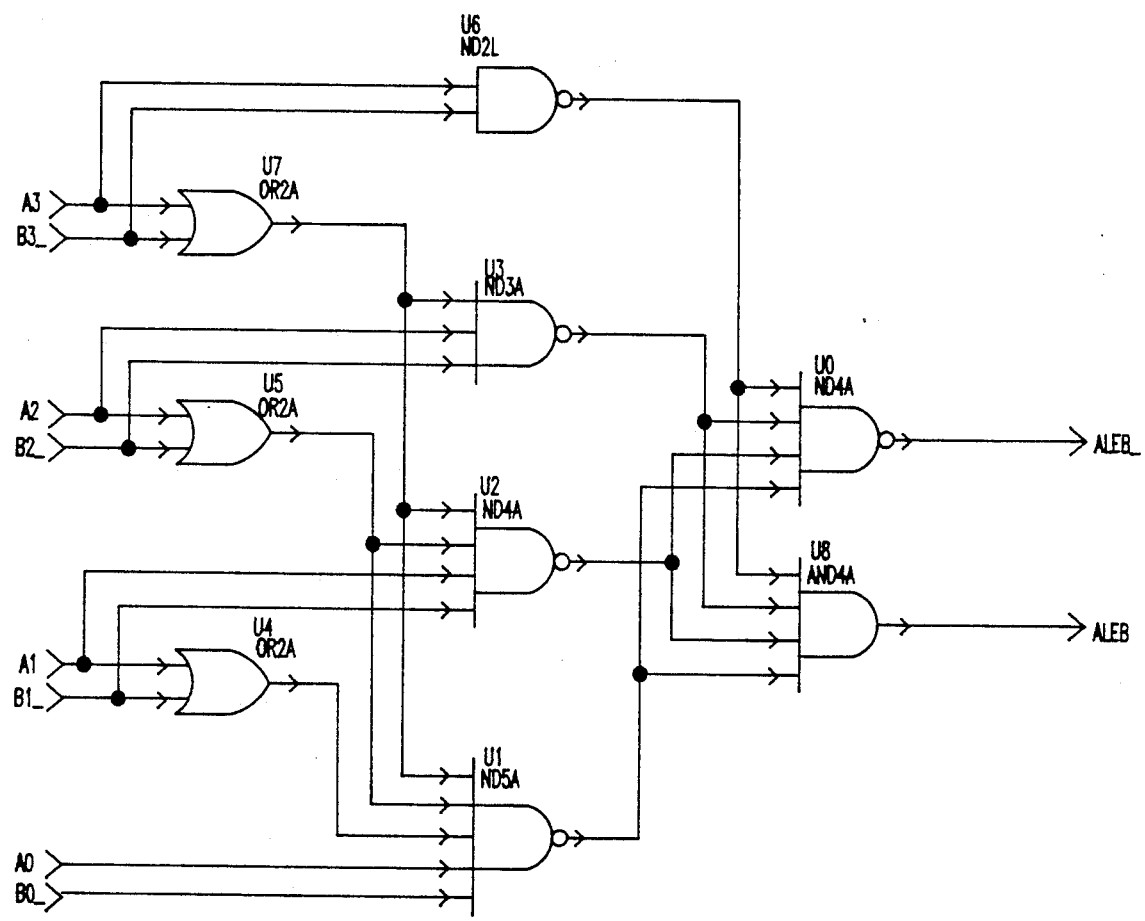
FIG. 9 shows the Comparator block schematic (CMP4B).
Figure 10:
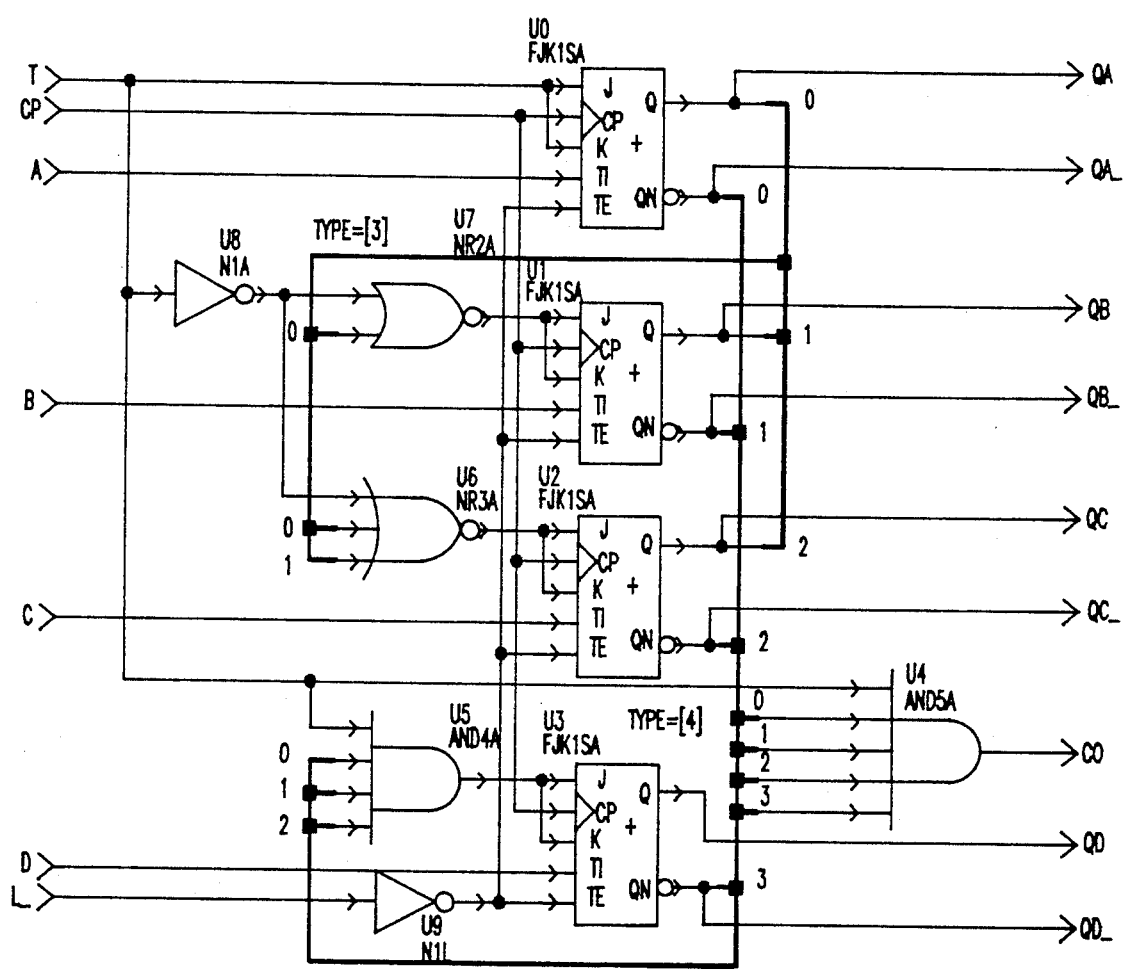
FIG. 10 shows the 4 bit down counter A schematic (DWNA4B).
Figure 11:
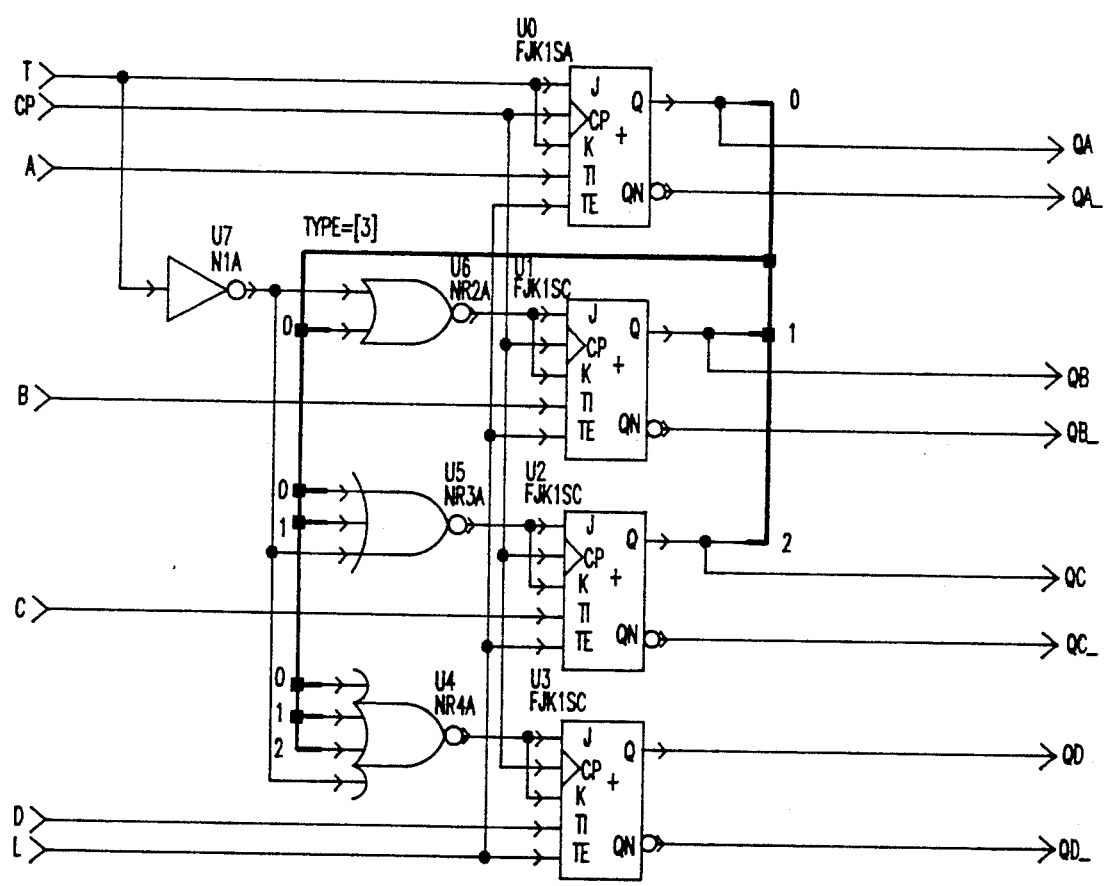
FIG. 11 shows the 4 bit down counter B schematic (DWNB4B).
Figure 12:
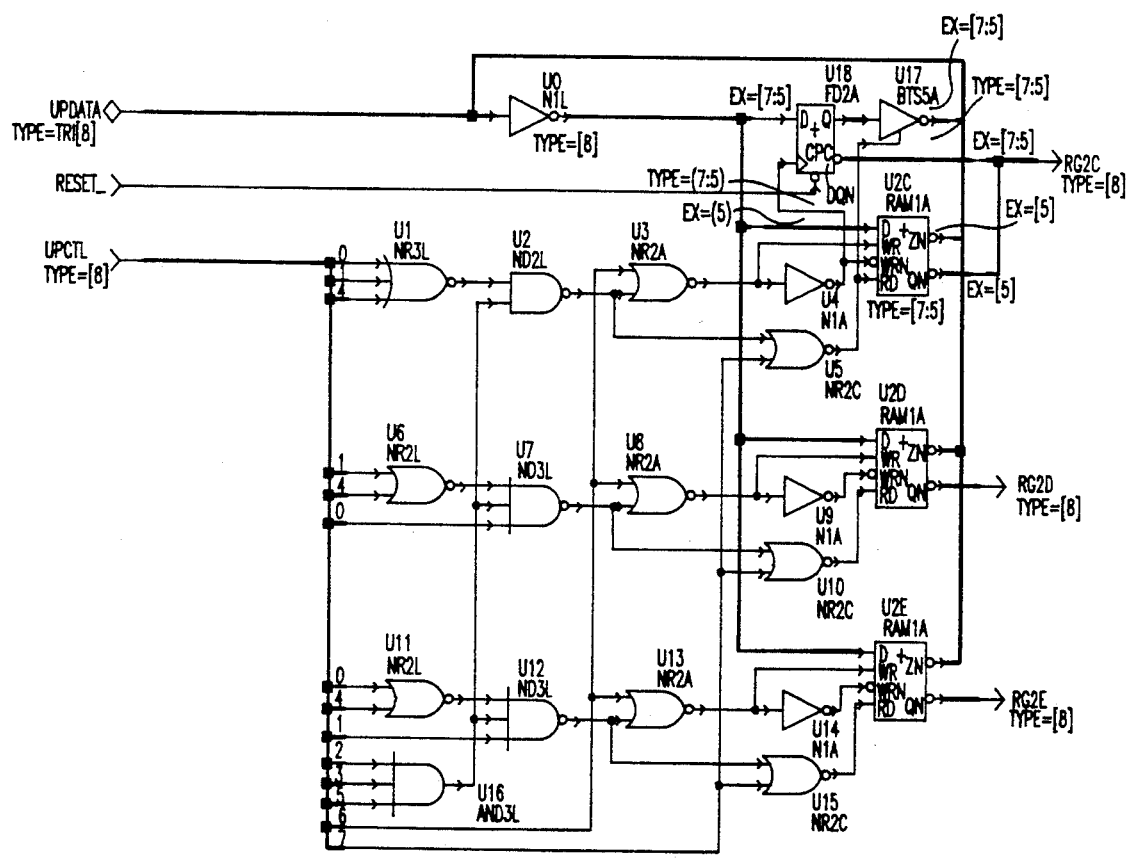
FIG. 12 shows the Register Storage Block (RG2C_2E).
Figure 13:
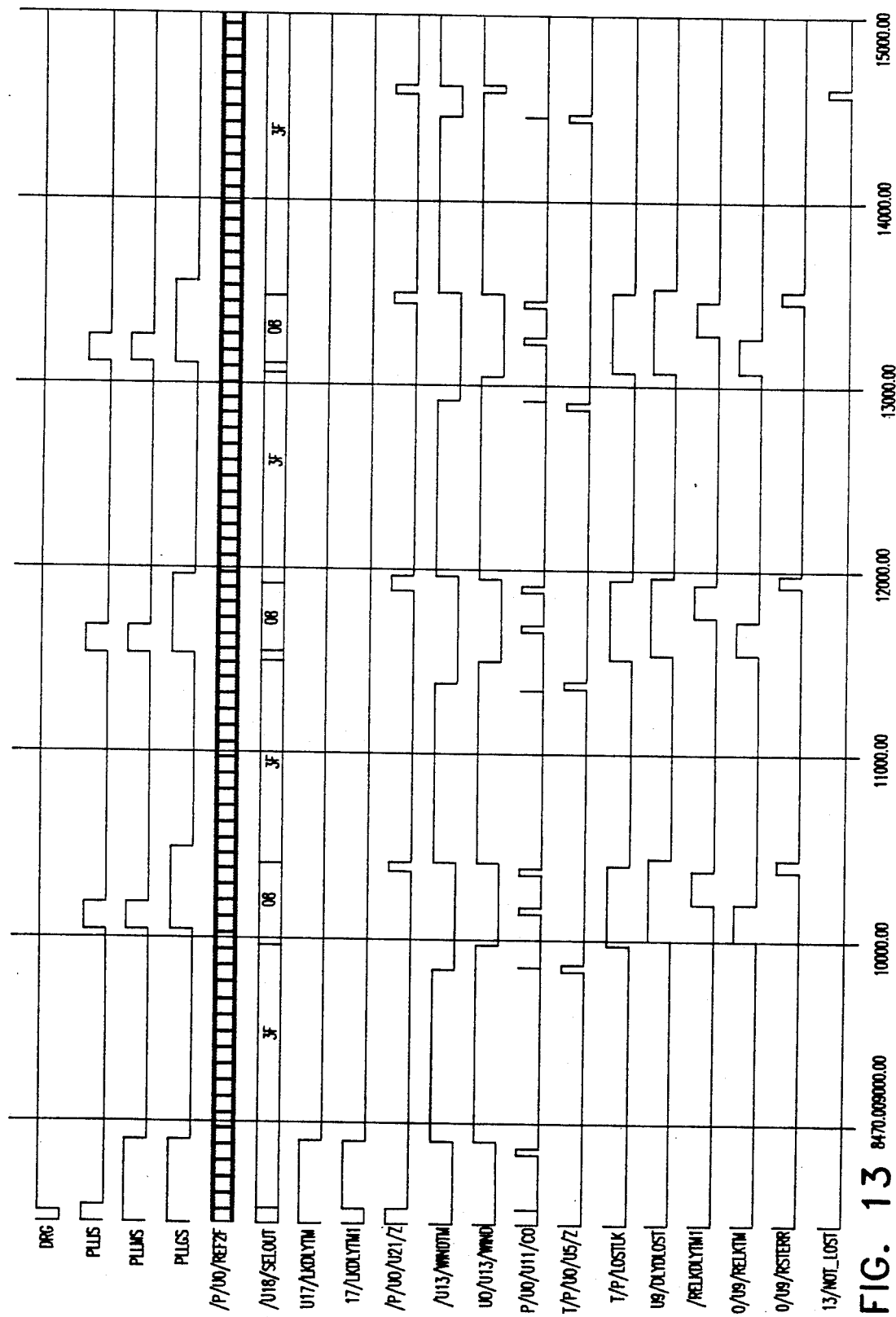
FIG. 13 shows an overall timing diagram for the detection and recovery cycles.
Figure 14:
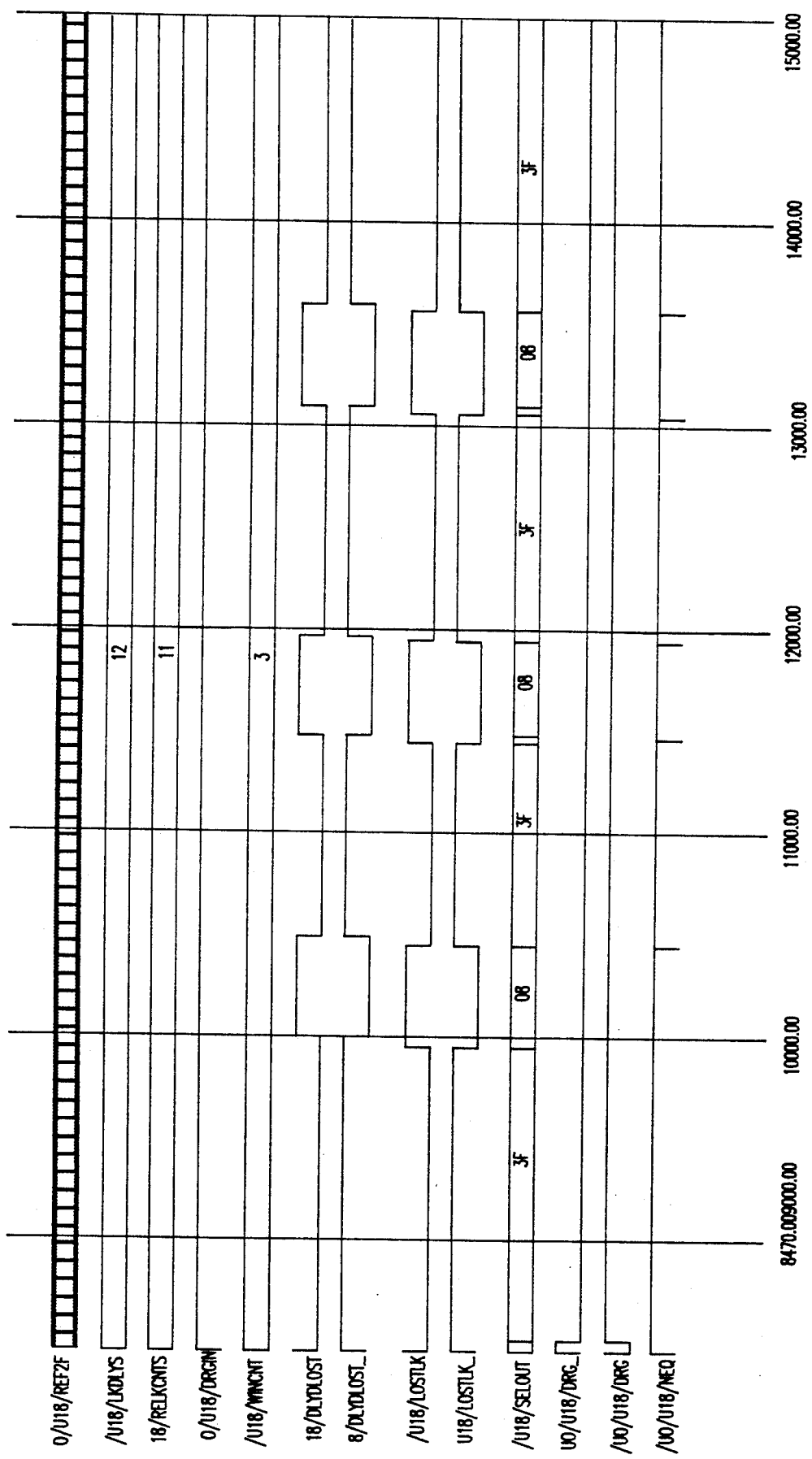
FIG. 14 shows a timing diagram for the REGSEL block (FIG. 5) during detection and recovery cycles.
Figure 15:
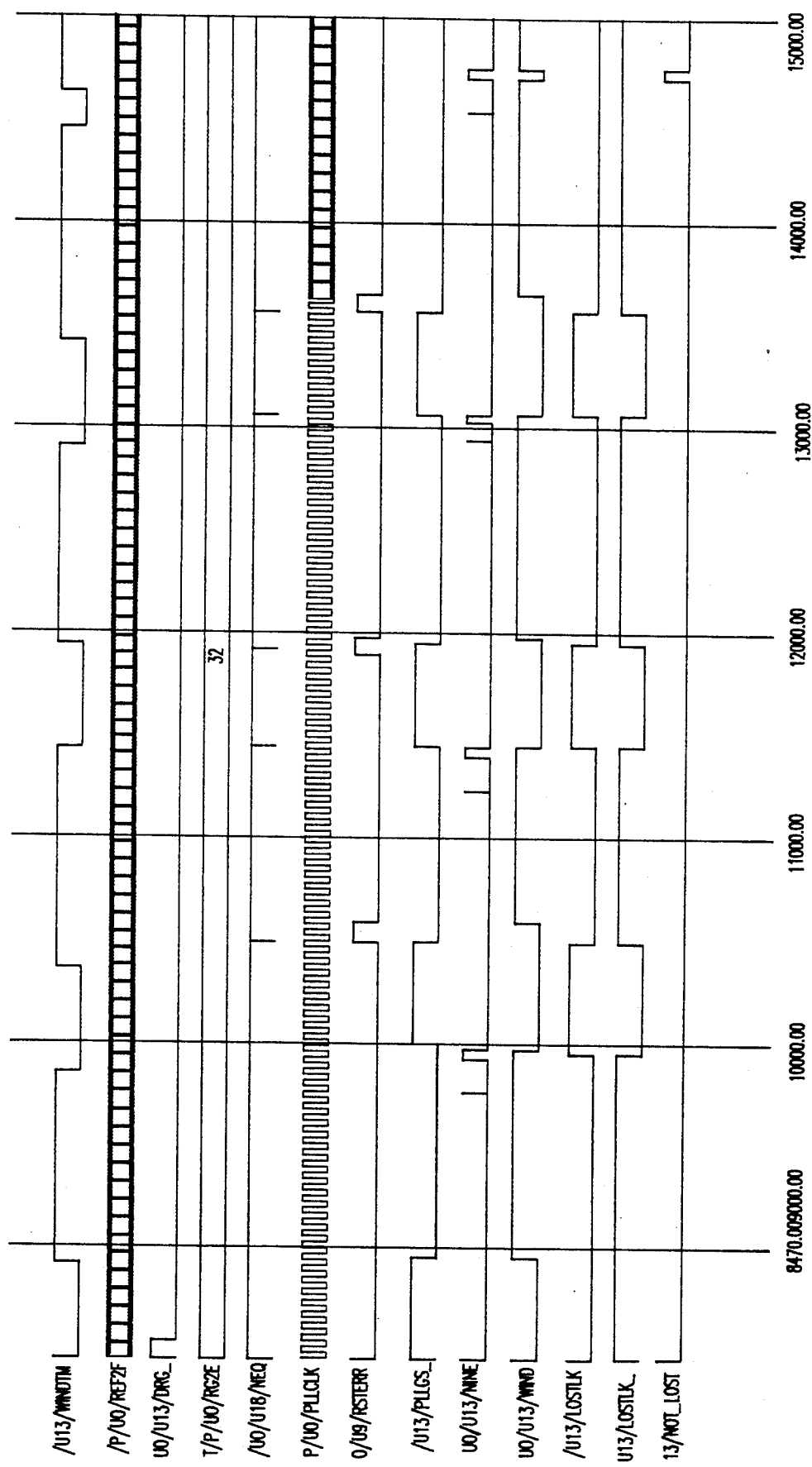
FIG. 15 shows a timing diagram for the WINDW block (FIG. 6) during detection and recovery cycles.
Figure 16:
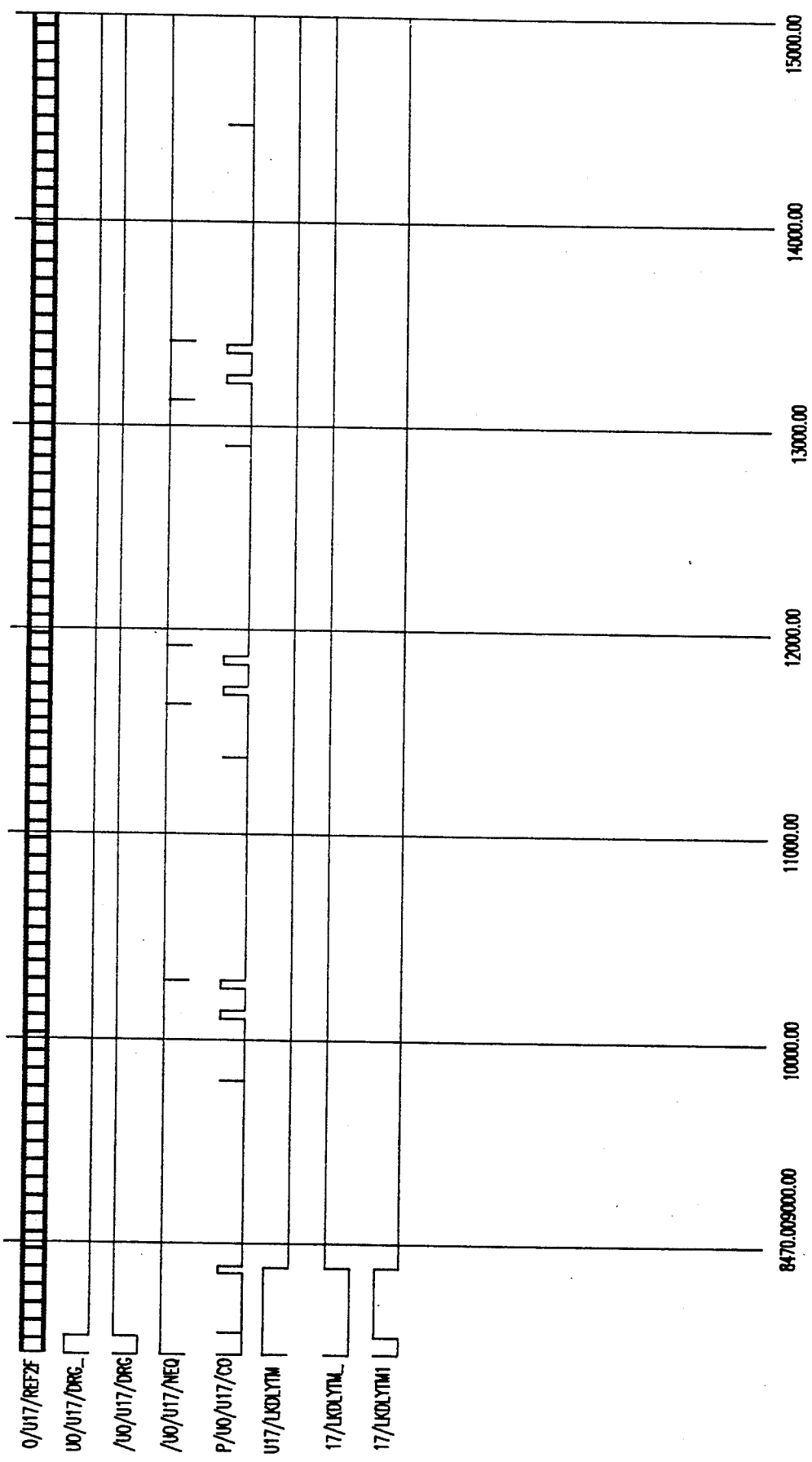
FIG. 16 shows a timing diagram for the LOCK block (FIG. 7) during detection and recovery cycles.
Figure 17:
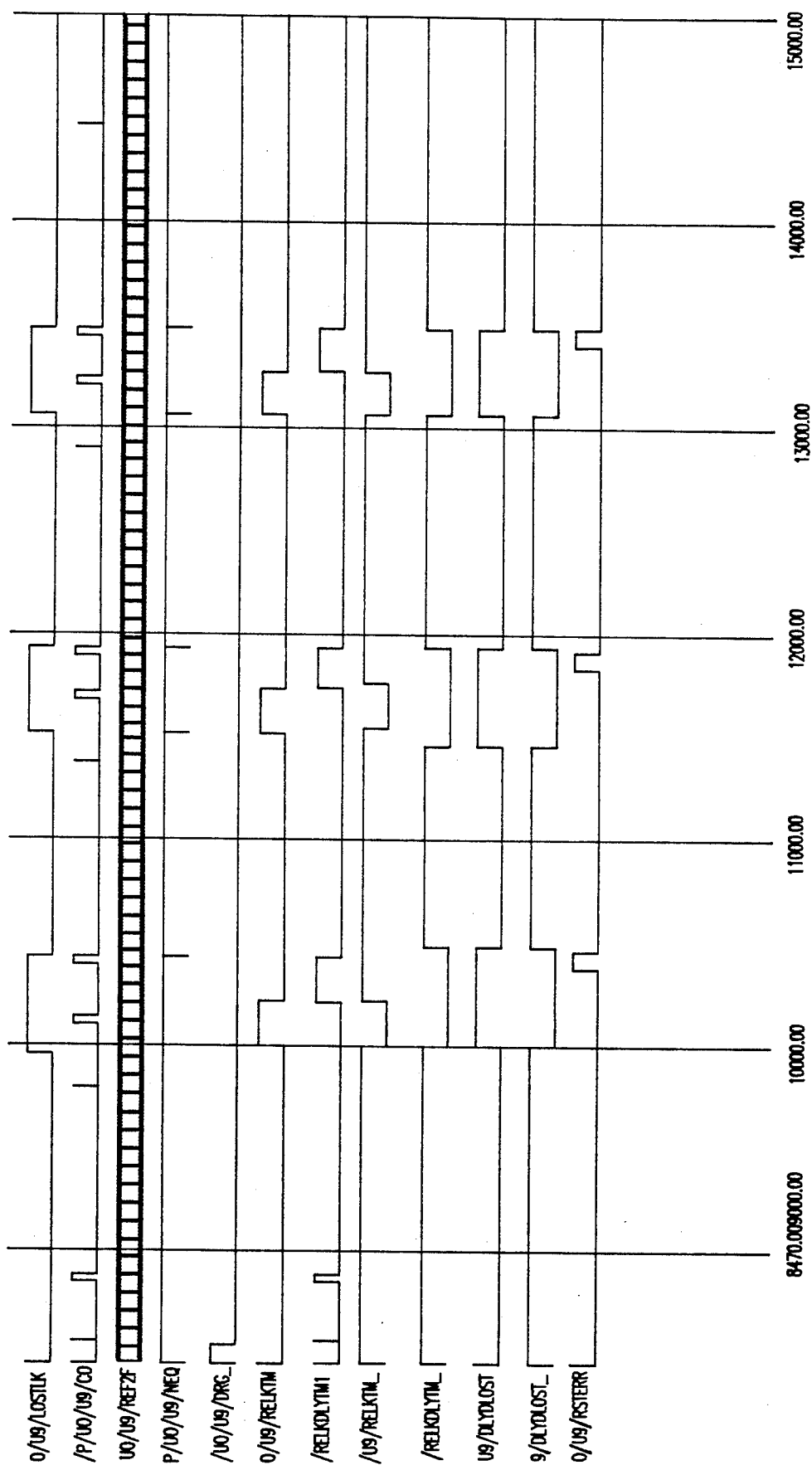
FIG. 17 shows a timing diagram for the RELOCK block (FIG. 8) during detection and recovery cycles.

The schematic in FIG. 4 presents the major functions of this specific implementation of the invention.

All counting functions except the PLLCLK Window Count are performed by the U10/U11 down counter. (The detector recovery circuitry could as easily be implemented around up counters if desired.) U10/U11 is clocked by REFCLK. The PLLCLK Window Counter is found in the WINDW Block (U13).

Upon activation by the rising edge of DRG, the preferred embodiment of the invention goes through a prescribed series of operations. These operation are LOCK, RE-LOCK and DETECTION. After the rising edge of DRG, the LOCK operation is started. After the LOCK operation terminates, a DETECTION operation is initiated. After the DETECTION function has completed, if Loss of Lock is detected, then a RE-LOCK operation is begun, otherwise, another DETECTION operation is started. If a RE-LOCK sequence was executed, it is followed by a DETECTION phase. The RE-LOCK/DETECTION cycle will continue until DRG is de-asserted or until lock is achieved. As long as DRG is active, while the two input clocks are in lock, the preferred embodiment of the invention will continue to execute the DETECTION operation.

The preferred embodiment of the invention is realized in the CL-SM330 integrated circuit with only two down counters. This is achieved by multiplexing the counter's initial values from their storage registers to the REFCLK counter (Referred to below as the U10/U11 counter) via the REGSEL module. Status lines from the modules WINDW, LOCK and RELOCK are connected to the REGSEL module and inform it of the state of the machine. At the proper time, based on the state of the machine and the count of the REFCLK counter, the REGSEL block outputs the proper value to be loaded into the REFCLK counter.

Refer to FIGS. 4 through 17 for the following discussion. In the example discussed, the PLL Lock Delay is set to two, the PLL Re-lock Time is set to one and the PLL Re-lock Delay is set to one. The Window Count is set to three and the Tolerance is set to two.

Within the REGSEL Block, Window Count is shifted left by one bit in order to make the value stored in register 2E represent multiples of sixteen REFCLK periods.

When DRG is not active, the detection and re-lock circuitry is not in use. During this time, the REGSEL is outputting the value for Lock Delay, which is continually being loaded into the U10/U11 counter.

When DRG is asserted, the LOCK block asserts the signal LKDLYTM1 to start the counter. At the same time, REGSEL has changes its SELOUT output to reflect the Window Count. After the Lock Delay has expired, CO causes the LOCK Block to de-assert the LKDLYTM1 signal and load the Window Count into the counter.

The WINDW Block now asserts the WIND signal, starting the counter again. The signal NINE decodes the value nine from the counter outputs. The signal NINE causes the counter U10/U11 and the PLLCLK counter U11/U12 to stop. On the first three WIND cycles, LOSTLK is asserted, indicating the value in the U11/U12 counter was outside of the Tolerance value. LOSTLK and DLYDLOST causes the REGSEL Block to output the Re-lock Time and the RELOCK Block outputs RELKTM to start the counter.

One REFCLK cycle later, the RELOCK Block sets DLYDLOST causing the REGSEL Block to output the Re-lock Delay time for subsequent loading into the counter.

After the CO signal is generated by the counter, RELOCK de-asserts RELKTM, stopping the counter, and asserts RELKDLYTM1, causing the loading and starting of the counter again.

When the counter asserts CO at the end of the Re-lock Delay time, RELOCK pulses RSTERR and the loss of lock detection sequence starts over again.

While a preferred embodiment of the present invention has been disclosed and described herein, it will be obvious to those skilled in the art that various changes in form and detail may be made therein without departing from the spirit and scope of the invention.

We claim:

1. A method of detecting loss of frequency lock comprising the steps of:
   (a) providing a REFCLK counter and a PLLCLK counter;
   (b) loading both the REFCLK counter and a PLLCLK counter with a window count;
   (c) initiating both counters at the same time to count down, the REFCLK counter in response to the reference clock signal REFCLK and the PLLCLK counter in response to the phase locked loop signal PLLCLK;
   (d) when the REFCLK counter reaches a terminal count, stopping the PLLCLK counter; and,
   (e) comparing the count of the PLLCLK counter to a predetermined tolerance to determine loss of frequency lock.

* * * * *